(12) United States Patent
Meng et al.

(10) Patent No.: US 12,188,116 B2
(45) Date of Patent: Jan. 7, 2025

(54) FREE-STANDING LITHIUM PHOSPHORUS OXYNITRIDE THINK FILMS AND METHODS OF THEIR MANUFACTURE

(71) Applicant: The Regents of the University of California, Oakland, CA (US)

(72) Inventors: Ying Shirley Meng, San Diego, CA (US); Diyi Cheng, La Jolla, CA (US); Thomas A. Wynn, Oceanside, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 18/041,793

(22) PCT Filed: Aug. 17, 2021

(86) PCT No.: PCT/US2021/046378
§ 371 (c)(1),
(2) Date: Feb. 15, 2023

(87) PCT Pub. No.: WO2022/040236
PCT Pub. Date: Feb. 24, 2022

(65) Prior Publication Data
US 2023/0313362 A1    Oct. 5, 2023

Related U.S. Application Data

(60) Provisional application No. 63/067,801, filed on Aug. 19, 2020.

(51) Int. Cl.
*C23C 14/06* (2006.01)
*C23C 14/00* (2006.01)
(Continued)

(52) U.S. Cl.
CPC ...... *C23C 14/0676* (2013.01); *C23C 14/0005* (2013.01); *C23C 14/024* (2013.01); *C23C 14/3407* (2013.01)

(58) Field of Classification Search
None
See application file for complete search history.

(56) References Cited

U.S. PATENT DOCUMENTS 6,251,487 B1    6/2001    Yonaha
6,524,775 B1    2/2003    Oberlander et al.
(Continued)

FOREIGN PATENT DOCUMENTS

WO    WO-2016033442 A1 *  3/2016    ............ B08B 3/045

OTHER PUBLICATIONS

A Stable Thin-Film Lithium Electrolyte: Lithium Phosphorus Oxynitride. Xiaohua Yu et al 1997 J. Electrochem. Soc. 144 524.*
(Continued)

*Primary Examiner* — Jason Berman
(74) *Attorney, Agent, or Firm* — Perkins Coie LLP

(57) ABSTRACT

Methods and articles of manufacture for free-standing lithium phosphorus oxynitride (LiPON) thin films are disclosed. The methods facilitate synthesizing the LiPON thin films in a free-standing form with controllable film thicknesses and areas. The free-standing LiPON thin films, absent a solid substrate contacting the LiPON thin films, enable studying fundamental properties of LiPON thin films including mechanical properties and glassy transition behavior. In some embodiments, the method includes modifying a surface of a substrate, forming a layer of LiPON on the modified surface of the substrate, and separating the layer of LiPON from the substrate. The free-standing LiPON thin films, no longer requiring solid substrates, may be used in applications requiring an ionically conductive or electronically insulating coating, film, or barrier layer.

20 Claims, 9 Drawing Sheets

(51) Int. Cl.
*C23C 14/02* (2006.01)
*C23C 14/34* (2006.01)

(56) References Cited

U.S. PATENT DOCUMENTS

| | | |
|---|---|---|
| 2005/0089803 A1 | 4/2005 | Bouaidat et al. |
| 2006/0066672 A1 | 3/2006 | Park et al. |
| 2006/0077529 A1 | 4/2006 | Chui et al. |
| 2016/0211547 A1 | 7/2016 | Hwang et al. |
| 2018/0159182 A1* | 6/2018 | Hellstrom ............... H01M 4/62 |

OTHER PUBLICATIONS

Bates, J.B., et al., "Electrical properties of amorphous lithium electrolyte thin films.", Solid State Ionics. 53-56 (1992) 647-654.

Kozen, A.C., et al., "Atomic Layer Deposition of the Solid Electrolyte LiPON", Chem. Mater. 2015, 27 (15), 5324-53 31.

Nam, Y.J., et al., "Bendable and Thin Sulfide Solid Electrolyte Film: A New Electrolyte Opportunity for Free-Standing and Stackable High-Energy All-Solid-State Lithium-Ion Batteries", Nano Letters, 2015, vol. 15, issue 5, pp. 3317-3323.

Su, Y., et al., "LiPON thin films with high nitrogen content for application in lithium batteries and electrochromic devices prepared by RF magnetron sputtering", Solid State Ionics, 2015, vol. 282, pp. 63-69.

Zhao, S., et al., "A Solid-State Electrolyte Lithium Phosphorus Oxynitride Film Prepared by Pulsed Laser Deposition", Thin Solid Films. 2002, 415 (1-2), 108-113.

ISA/US, International Search Report and Written Opinion for Application No. PCT/US21/46378, Mail Date: Nov. 24, 2021, 9 pages.

\* cited by examiner

FREE-STANDING LITHIUM PHOSPHORUS OXYNITRIDE THINK FILMS AND METHODS OF THEIR MANUFACTURE

CROSS-REFERENCE TO RELATED APPLICATION

This patent document is a U.S.C. § 371 National Stage application of International Application No. PCT/US2021/046378 titled "FREE-STANDING LITHIUM PHOSPHORUS OXYNITRIDE THIN FILMS AND METHODS OF THEIR MANUFACTURE" and filed on Aug. 17, 2021, which claims priority to and benefits of U.S. Provisional Application No. 63/067,801, titled "FREE-STANDING LITHIUM PHOSPHORUS OXYNITRIDE (UPON) THIN FILMS AND METHODS OF THEIR MANUFACTURE" and filed on Aug. 19, 2020. The entire contents of the before-mentioned patent application are incorporated by reference as part of the disclosure of this document.

GOVERNMENT RIGHTS

This invention was made with government support under DE-SC0002357 awarded by the Department of Energy. The government has certain rights in the invention.

TECHNICAL FIELD

This patent document relates to solid electrolyte materials.

BACKGROUND

A lithium-ion battery (Li-ion battery) is a type of rechargeable battery. Lithium-ion batteries are commonly used for portable electronics, electric vehicles, and a variety of other applications and products. In Li-ion batteries, lithium ions move from the negative electrode through an electrolyte to the positive electrode during discharge, and back when charging. Li-ion batteries commonly use an intercalated lithium compound as the material at the positive electrode and graphite at the negative electrode. Li-ion batteries have a high energy density, no memory effect, and low self-discharge.

SUMMARY

Lithium phosphorus oxynitride (LiPON), a solid electrolyte material, is an amorphous solid-state lithium ion conductor including robust cyclability against lithium metal anodes. This patent document discloses compositions or materials, methods, articles of manufacture, and devices that pertain to the solid electrolyte material, LiPON.

The present technology described in this patent document provides a novel way to synthesize LiPON in a free-standing form with controllable film thickness and area. In some embodiments, the free-standing LiPON thin films exhibit a high degree of flexibility highlighting the unique mechanical properties of glassy materials. Moreover, the free-standing LiPON thin films can be at least partially transparent to visible light. The free-standing LiPON thin films synthesized in accordance with the present technology may be used in applications utilizing an ionically conductive or electronically insulating coating, film, or barrier layer. In some embodiments, the free-standing LiPON thin films can be used as solid electrolyte in all-solid-state battery systems or as separator materials in liquid-electrolyte-based battery systems. In some embodiments, the free-standing LiPON thin films can be used as flexible electronically insulating layers. In some embodiments, the free-standing LiPON thin films can be used in electrochromic window applications.

In some embodiments, a method in accordance with the present technology includes modifying a surface of a substrate. Further, the method includes forming a layer of LiPON on the modified surface of the substrate. Thereafter, the method includes separating the layer of LiPON from the substrate, thereby obtaining a free-standing layer of LiPON. In some embodiments, modifying the surface of the substrate includes depositing a sacrificial layer on the surface of the substrate, the sacrificial layer having a first removal rate greater than a second removal rate of the layer of LiPON. In some embodiments, separating the layer of LiPON from the substrate includes selectively removing the sacrificial layer between the surface of the substrate and the layer of LiPON.

In some embodiments, a method in accordance with the present technology includes coating a surface of a glass substrate with a layer of photoresist. Further, the method includes depositing a layer of LiPON on the layer of photoresist. Further, the method includes immersing the glass substrate carrying the layer of photoresist and the layer of LiPON in a solution configured to selectively dissolve the layer of photoresist. Thereafter, the method includes lifting the layer of LiPON from the solution.

Also disclosed in this patent document are novel material structures of LiPON, which include representations of a structural model of LiPON formed by radio frequency (RF) sputtering. In some embodiments, the material structures are determined based on experimental and computational spectroscopic methods. For example, 1-dimensional (1D) and 2-dimensional (2D) solid-state nuclear magnetic resonance experiments are performed on the layer of free-standing LiPON to investigate chemical shift anisotropy and dipolar interactions so as to obtain information about the short-range structure of LiPON. Further, chemical shielding calculations of Li—P—O/N structures based on first principles and ab initio molecular dynamics-generated amorphous LiPON models are compared with the information to identify the glassy structure of LiPON as primarily isolated phosphate monomers with N incorporated in both apical and as bridging sites in phosphate dimers. The structural model suggests that LiPON's stability is a result of its glassy character.

The present technology can be implemented in specific ways that provide one or more of the following features described herein.

BRIEF DESCRIPTION OF THE DRAWINGS

Many aspects of the present technology can be better understood with reference to the following drawings. The components in the drawings are not necessarily to scale. Instead, emphasis is placed on illustrating the overall features and the principles of the present technology.

DETAILED DESCRIPTION

Figure 1A:
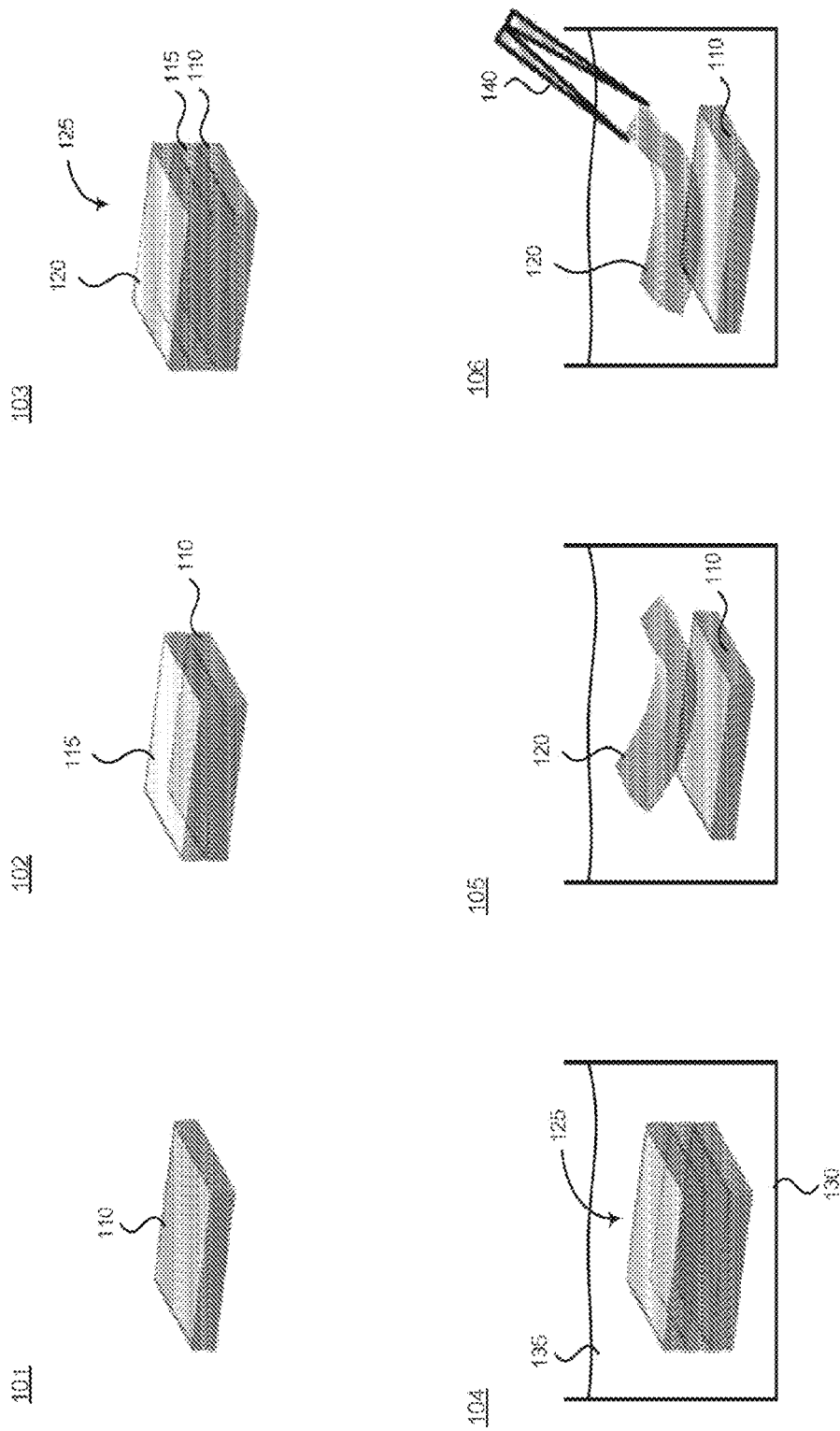
FIG. 1A shows schematic diagrams illustrating example process steps to synthesize free-standing LiPON thin films in accordance with embodiments of the present technology.

Lithium phosphorus oxynitride (LiPON) is a popular amorphous solid electrolyte used in thin-film solid-state lithium ion batteries. An electrolyte in a battery serves as a medium between an anode and a cathode of the battery, which provides electrical isolation between the anode and cathode while allowing ions (e.g., lithium ions) to migrate between the anode and cathode during the battery operation—e.g., charging and discharging. Thin-film solid-state batteries includes multiple layers of various materials formed by thin-film deposition techniques, such as RF sputtering, pulsed laser deposition, or atomic layer deposition. Typically, such thin-film deposition techniques require rigid substrates (e.g., substrates including silicon, silicon-oxide, alumina, or the like), on which the thin-films of various materials are deposited. Accordingly, the thin-film solid-state batteries are built on rigid substrates.

In some cases, the rigid substrates in the thin-film solid-state batteries can hinder progress of proliferating applications of the thin-film solid-state batteries (e.g., due to form factor limitations) or of establishing fundamental scientific knowledge of the thin-film materials used in the thin-film solid-state batteries. For example, LiPON is an amorphous solid-state lithium ion conductor displaying superb cyclability against lithium metal anodes. But there is no definitive explanation for this stability due to the limited understanding of the structure of LiPON. In some cases, the amorphous nature of LiPON may make it difficult to analyze LiPON deposited on the substrate by the thin-film deposition techniques. Additionally, or alternatively, presence of the substrate (typically a few hundred micrometers (μm) thick) carrying the material of interest (e.g., LiPON thin films, typically a few μm thick) may dominate analytical signals to make scientific studies difficult to establish fundamental material properties—e.g., LiPON's mechanical properties and glassy transition behavior.

The present technology disclosed in this patent document facilitates production of a LiPON thin film in a novel free-standing form (a free-standing LiPON thin film) without a rigid substrate. The free-standing LiPON thin films synthesized in accordance with the present technology exhibit a high degree of flexibility highlighting the unique mechanical properties of glassy materials. Moreover, the free-standing LiPON thin film can be at least partially transparent to visible light.

As described in more detail herein, the present technology modifies a surface of a substrate prior to depositing a layer of LiPON (e.g., via RF sputtering a $Li_3PO_4$ target) on the modified surface in contrast to conventional techniques that directly deposit LiPON on the surface of the substrate without modifying or treating the surface. In some embodiments, modifying the surface of the substrate includes depositing a sacrificial layer on the surface of the substrate. The sacrificial layer can be configured to have (or selected to have) a removal rate that is greater than that of the layer of LiPON. In this manner, the sacrificial layer can be selectively removed (e.g., etched, dissolved) without significantly affecting the layer of LiPON, thereby separating (e.g., loosening, releasing) the layer of LiPON from the substrate to obtain the free-standing LiPON thin films.

This patent document also describes a variety of analytical results that confirm the free-standing LiPON thin films (i.e., LiPON deposited on the sacrificial layer) include consistent material properties to those of conventional LiPON thin films (i.e LiPON deposited on solid substrates). By way of examples for the conventional LiPON thin films that are directly deposited on solid substrates, a study by Bates et al. reported that LiPON thin film can be synthesized by RF sputtering using $Li_3PO_4$ target in a $N_2$ atmosphere with an ionic conductivity of $2 \times 10^{-6}$ S/cm (see J. B. Bates, N. J. Dudney, G. R. Gruzalski, R. A. Zuhr, A. Choudhury, C. F. Luck, Electrical properties of amorphous lithium electrolyte thin films. Solid State Ionics. 53-56 (1992)647-654); a study of Kozen et al. illustrated that a LiPON thin film can be synthesized by atomic layer deposition using tert-butoxide, $H_2O$, trimethylphosphate and plasma $N_2$ as precursors with an ionic conductivity of $3 \times 10^{-7}$ S/cm (see A. C. Kozen, A. J. Pearse, C. F. Lin, M. Noked, G. W. Rubloff, Atomic Layer Deposition of the Solid Electrolyte LiPON. Chem. Mater. 2015, 27 (15), 5324-5331); and a study of Zhao et al. reported that pulsed laser deposited LiPON thin film using $Li_3PO_4$ target in a $N_2$ gas atmosphere exhibits an ionic conductivity of $1.6 \times 10^{-6}$ S/cm (see S. Zhao, Z. Fu, Q. Qin, A Solid-State Electrolyte Lithium Phosphorus Oxynitride Film Prepared by Pulsed Laser Deposition. Thin Solid Films. 2002, 415 (1-2), 108-113).

The free-standing LiPON thin films can largely motivate and ease additional characterization methods to potentially achieve a scientific breakthrough in understanding this material. Moreover, the free-standing LiPON thin films can increase the flexibility of geometries for devices including the free-standing LiPON thin films (e.g., no longer requiring rigid substrates that tend to impose restrictive form factor requirements), and may be applied to a variety of alternative architectures. It is envisioned that the free-standing LiPON thin films can be used as solid electrolytes in all-solid-state battery systems or as separator materials in liquid-electrolyte-based battery systems—e.g., placed between the anode and cathode of the thin-film solid-state lithium ion batteries. Moreover, the free-standing LiPON thin films can also be used as a flexible electronically insulating layer. In some embodiments, the free-standing LiPON thin films can be used in electrochromic window applications in view of its transparent nature to the visible light, in which transparency of glass windows can be electrically controlled—e.g., smart windows applications.

Also disclosed in this patent document are novel material structures of the free-standing LiPON thin films determined via experimental and computational spectroscopic methods. As described in more details herein, the material structures of the free-standing LiPON thin films include representations of a structural model of RF-sputtered LiPON. The material structures are determined based on extensive experimental studies performed on the free-standing LiPON thin films. Moreover, computational spectroscopic methods are used to compare the experimental results with theoretical results that are deduced based on first principles and ab initio approaches.

For example, 1-dimensional (1D) and 2-dimensional (2D) solid-state nuclear magnetic resonance (NMR) experiments are performed on the layer of free-standing LiPON thin films to investigate chemical shift anisotropy and dipolar interactions. The NMR experiments generate information about the short-range structure of the free-standing LiPON thin films, which have been confirmed to be in an amorphous phase as described herein. Further, chemical shielding calculations of Li—P—O/N structures are carried out based on first principles and ab initio molecular dynamics-generated amorphous LiPON models. Subsequently, the information generated by the NMR experiments and the chemical shielding calculations are compared to identify the glassy structure of the free-standing LiPON thin film as primarily isolated phosphate monomers with nitrogen (N) incorporated in both apical and as bridging sites in phosphate dimers. The structural model suggests that LiPON's stability is a result of its glassy character. Further details of characterizing material structures and properties of the free-standing LiPON thin films are described in the above-identified U.S. Provisional Application No. 63/067,801.

Figure 1B:
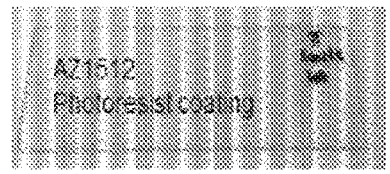
FIG. 1B shows photographs depicting example process steps to synthesize free-standing LiPON thin films in accordance with embodiments of the present technology.
Figure 1B:
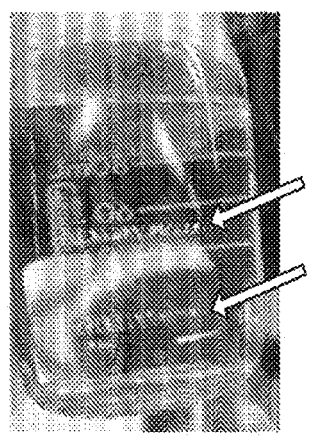
Figure 1B:
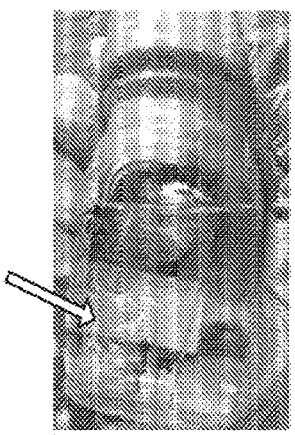
Figure 1B:
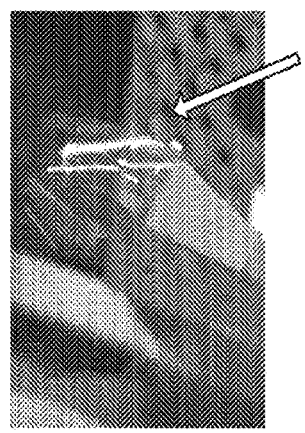
Figure 1B:
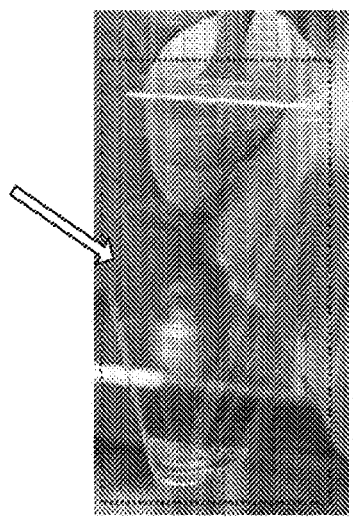
Figure 6:
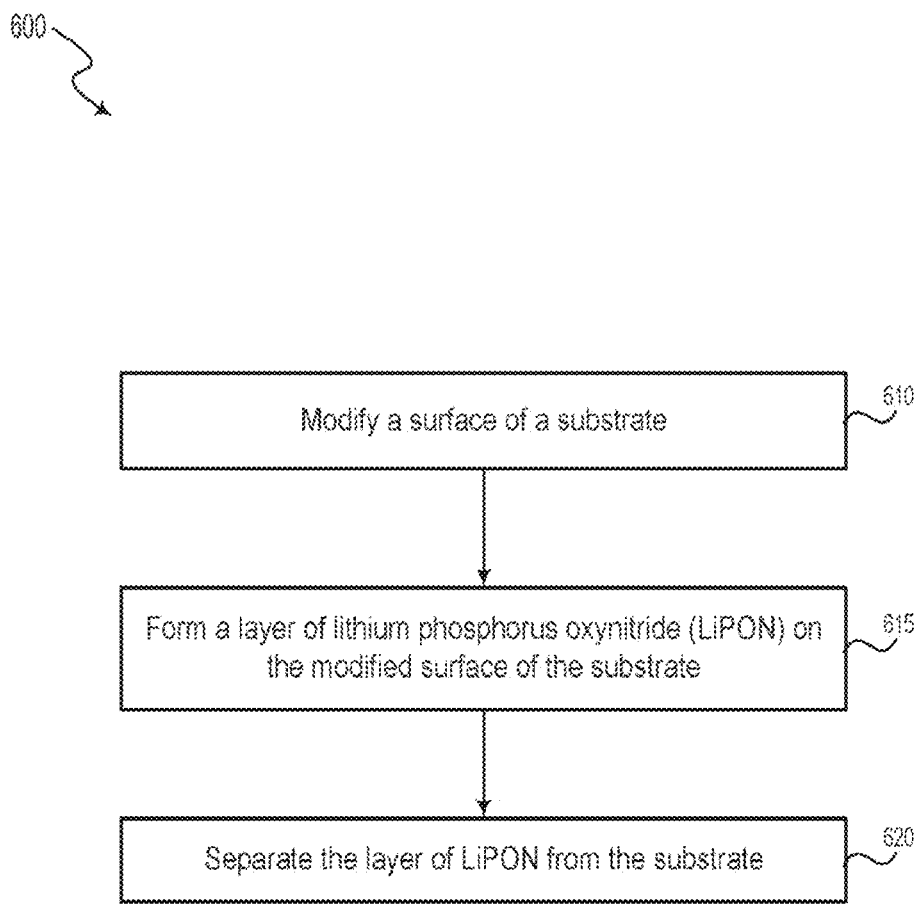
FIGS. 6 and 7 are flowcharts of methods of synthesizing free-standing LiPON thin films in accordance with embodiments of the present technology.
Figure 7:
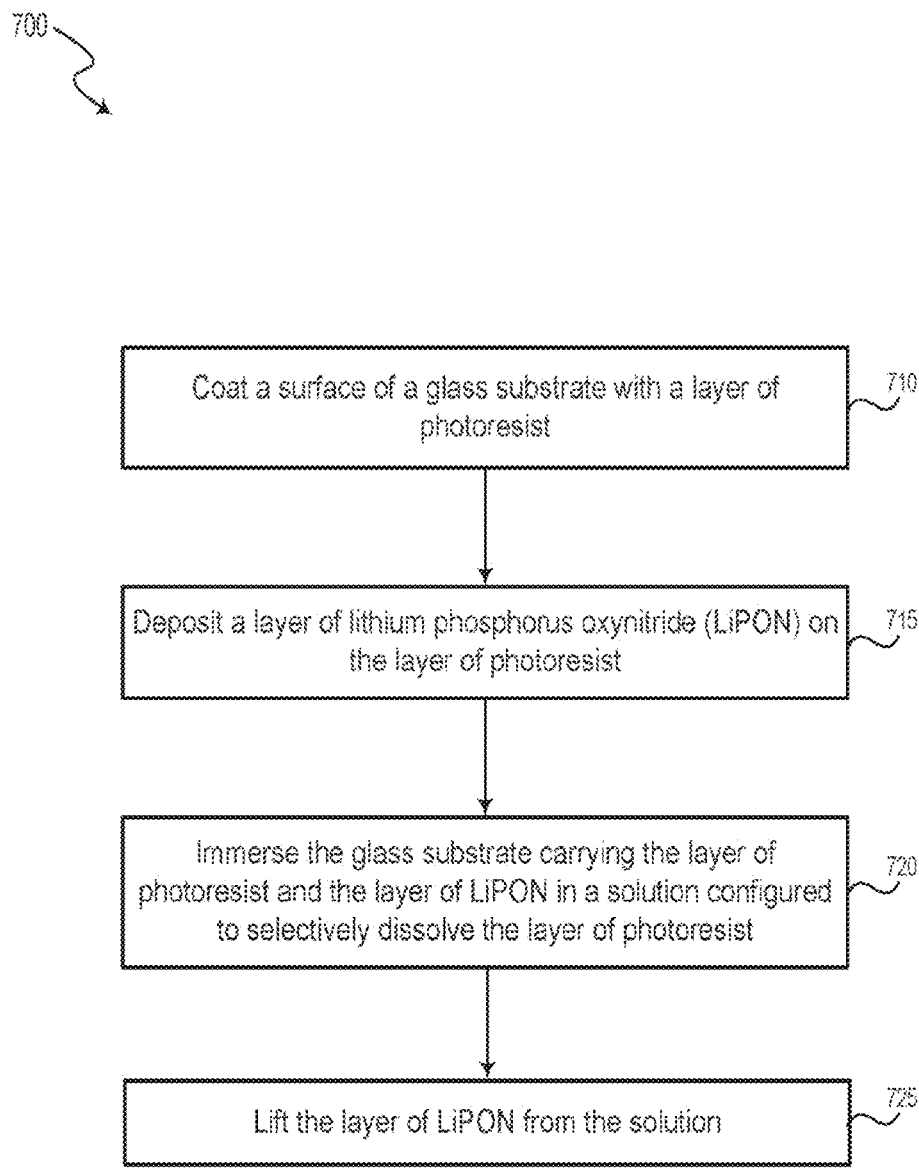

FIGS. 1A and 1B illustrate example process steps and photographs depicting certain process steps in accordance with embodiments of the present technology. FIGS. 2 through 5 describe various analytical results confirming that the free-standing LiPON thin films include material properties consistent with the conventional LiPON thin films deposited on solid substrates. FIGS. 6 and 7 are flowcharts of methods of synthesizing the free-standing LiPON thin films in accordance with embodiments of the present technology.

FIG. 1A shows schematic diagrams illustrating example process steps to synthesize free-standing LiPON thin films in accordance with embodiments of the present technology. FIG. 1A includes diagrams 101 through 106 depicting various process steps to synthesize free-standing LiPON thin films.

Diagram 101 illustrates a substrate 110. In some embodiments, the substrate 110 include silicon, silicon oxide, alumina, glass, or a suitable component to provide a rigid surface for a layer of LiPON to be deposited.

Diagram 102 illustrates a surface of the substrate 110, which has been modified (e.g., altered, treated). In some embodiments, modifying the surface of the substrate 110 includes depositing a sacrificial layer 115 on the surface of the substrate 110. Further, the sacrificial layer 115 may include a first removal rate greater than a second removal rate of a layer of LiPON to be deposited on the sacrificial layer 115. In some embodiments, the sacrificial layer 115 includes a photoresist, and modifying the surface of the substrate includes coating the surface of the substrate 110 with the photoresist.

In some embodiments, coating the surface of the substrate 110 with the photoresist includes applying the photoresist on the surface of the substrate, and rotating the substrate with the photoresist at speeds ranging from 500 revolutions per minutes (RPM) to 2,000 RPM for durations ranging from 40 seconds to 80 seconds—e.g., a spin coating process. In some embodiments, the photoresist is AZ1512 and the substrate 110 is a glass substrate. Table 1 shows example spin coating recipes for coating the AZ1512 photoresist on the glass substrate.

TABLE 1

| Spin coating recipe | Ramp time | Spin time |
| --- | --- | --- |
| 500 RPM | 20 s | 20 s |
| 1000 RPM | 20 s | 20 s |
| 2000 RPM | 20 s | 60 s |

In some embodiments, modifying the surface of the substrate 110 includes exposing the photoresist that has been coated (e.g., spin coated) to ultraviolet (UV) light—e.g., in a chamber generating the UV light. In some embodiments, the photoresist may be exposed to the UV light for 5 minutes. In some embodiments, the photoresist may be exposed to the UV light of the sun light.

Diagram 103 illustrates that a layer of LiPON 120 has been formed on the modified surface of the substrate 110—e.g., on the surface of the sacrificial layer 115. In some embodiments, forming the layer of LiPON includes depositing LiPON by RF sputtering a target of $Li_3PO_4$ in an environment including nitrogen (e.g., a $N_2$ atmosphere). Moreover, the RF sputtering the $Li_3PO_4$ target may include setting the RF power to 50 W with minimal reflected power, setting the $N_2$ gas pressure at 15 mTorr, or maintaining a distance between the target and the substrate 110 at 5 cm. In some embodiments, the $Li_3PO_4$ target is 2 inch in diameter. In some embodiments, a deposition rate of the LiPON thin film corresponds to approximately 3 nm per minutes (e.g., 3.28 nm/min). The substrate 110 carrying the sacrificial layer 115 and the layer of LiPON 120 may be referred to as a stack 125.

Diagram 104 illustrates that the stack 125 has been immersed in a solution 135 of a container 130. The solution 135 may be configured to selectively remove the sacrificial layer 115 without affecting the layer of LiPON 120. For example, the sacrificial layer 115 has a first removal rate in the solution 135 that is greater than a second removal rate of the layer of LiPON 120 in the solution 135. In some embodiments, the sacrificial layer 115 corresponds to a photoresist (e.g., AZ1512) and the solution 135 includes organic solvent (e.g., dimethyl carbonate (DMC)). In such embodiments, selectively dissolving the AZ1512 photoresist includes immersing the substrate with the layer of LiPON (i.e., the stack 125) in the solution 135 including DMC for twelve (12) hours.

Diagram 105 illustrates that that the stack 125 has been immersed in the solution 135 sufficiently long enough (e.g., 12 hours or more) such that the sacrificial layer 115 (e.g., AZ1512 photoresist) is removed (e.g., dissolved in the solvent including DMC). As a result of selectively removing the sacrificial layer 115, the layer of LiPON 120 may separate from the substrate 110.

Diagram 106 illustrates that that the layer of LiPON 120 can be lifted (e.g., picked up, peeled off from the substrate 110) from the solution 135 using a tweezer 140 (e.g., a flat-tip tweezer). The layer of LiPON 120, after being picked up from the container 130, is not in contact with the substrate 110. In this manner, free-standing LiPON thin films can be synthesized.

In some embodiments, a layer of LiPON includes a first surface and a second surface opposite to the first surface, where both the first and second surfaces are not in contact with an external structure. In some embodiments, the first and second surfaces, absent any external structure attached thereto, are configured to enable experiments to determine a microscopic structure of the LiPON layer, such as solid-state nuclear magnetic resonance experiments. In some embodiments, at least a portion of the LiPON layer is a free-standing and flexible thin-film layer. In some embodiments, at least a portion of the LiPON layer has a thickness of approximately 3.7 µm (e.g., 3.7±0.18 µm, 3.7±0.37 µm, 3.7±0.55 µm, or the like). In some embodiments, at least a portion of the LiPON layer is at least partially transparent to visible light In some embodiments, at least a portion of the LiPON layer is flexible to bend in response to external force applied thereto.

FIG. 1B shows photographs depicting example process steps to synthesize free-standing LiPON thin films in accordance with embodiments of the present technology. FIG. 1B include diagrams 107, 108a/b, and 109a/b showing photographs taken during the fabrication of the free-standing LiPON thin films.

Diagram 107 is a photograph showing the substrate 110 (e.g., a glass slide) with its surface modified (e.g., AZ1512 photoresist has been spin-coated), which corresponds to the substrate 110 with the sacrificial layer 115 formed on the substrate 110 as shown in diagram 102.

Diagram 108a is a photograph showing the stack 125 (e.g., the substrate 110 carrying the sacrificial layer 115 and the layer of LiPON 120) immersed in the solution 135. The photograph of diagram 108a shows the layer of LiPON 120 starting to peel-off (e.g., lifted up) at the edges of the layer of LiPON 120 as indicated by two arrows pointing to the edges where different contrasts start to develop. Then, the layer of LiPON 120 gradually peels off from the substrate 110. Diagram 108b is a photograph showing the layer of LiPON 120 separated from the substrate 110-i.e., the sacrificial layer 115 (e.g., AZ1215 photoresist) no longer holding the layer of LiPON 120 attached to the substrate 110.

Diagram 109a is a photograph showing the layer of LiPON 120 picked up from the solution 135 (as indicated by an arrow) using a flat-tip tweezer—e.g., a free-standing LiPON thin film. Diagram 109b is another photograph showing another free-standing LiPON thin film (as indicated by a dotted rectangle pointed by an arrow) held by a flat-tip tweezer. As shown in diagrams 109a and 109b, the free-standing LiPON thin films can be synthesized to have different shapes or areas, and thicknesses (by controlling the RF sputtering time, for example).

Although the example process steps with reference to FIGS. 1A and 1B describe removing the sacrificial layer 115 in a liquid solution (e.g., the solution 135) by completely submerging the stack 125 in the liquid solution, the present technology is not limited thereto. For example, the sacrificial layer 115 can be removed in a process chamber configured to provide a gaseous etching environment. Further, the layer of LiPON 120 may be patterned (e.g., using photolithography and etching process steps) to expose the sacrificial layer 115 underneath to facilitate the gaseous etching process (or the liquid etching process). Such patterning of the layer of LiPON 120 may provide for additional degrees of freedom to synthesize the free-standing LiPON thin film having certain predetermined shapes.

Figure 2:
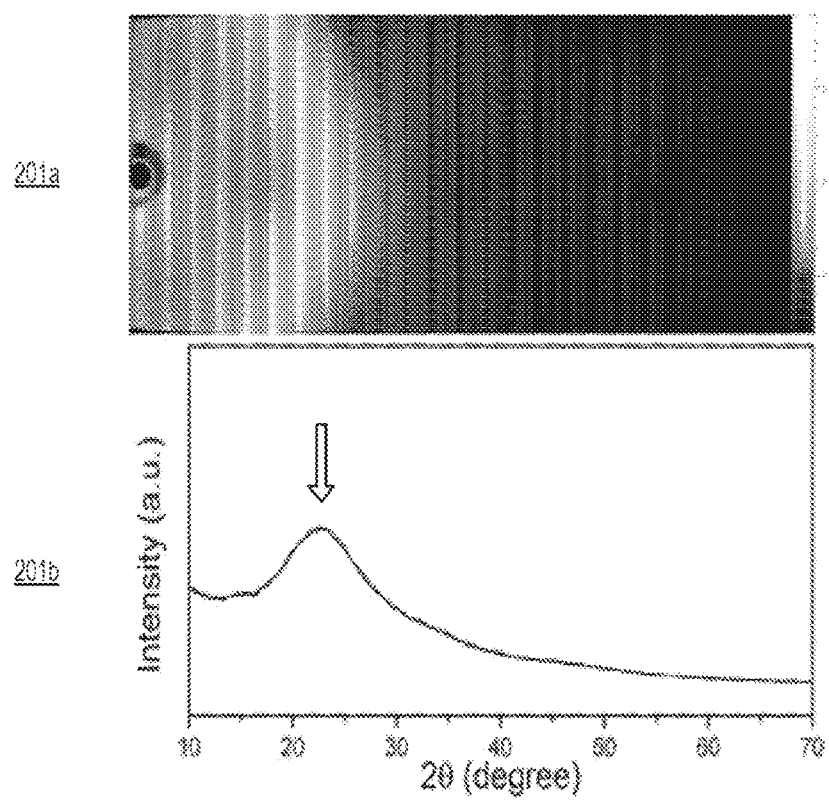
FIG. 2 shows X-ray diffraction (XRD) results from free-standing LiPON thin films synthesized in accordance with embodiments of the present technology.

FIG. 2 shows X-ray diffraction (XRD) results from free-standing LiPON thin films synthesized in accordance with embodiments of the present technology. XRD analyses can be used to determine crystallographic structures of solid materials. FIG. 2 includes diagrams 201a and 201b showing the XRD results from an as-obtained free-standing LiPON thin film synthesized in accordance with embodiments of the present technology.

Diagram 201a shows no diffraction spots present confirming that no crystallization has occurred in the free-standing LiPON thin film—e.g., by forming $Li_2CO_3$. Further, diagram 201 plotting integrated signals during XRD analyses shows an amorphous feature ("hump") at around 23 degree (denoted by an arrow). This amorphous feature is regarded as a typical sign indicating that the material under the XRD analysis is in an amorphous phase. Accordingly, the XRD results from the free-standing LiPON thin film indicates that the free-standing LiPON thin film is amorphous, which is consistent with the conventional LiPON thin films deposited on rigid substrates.

Figure 3:
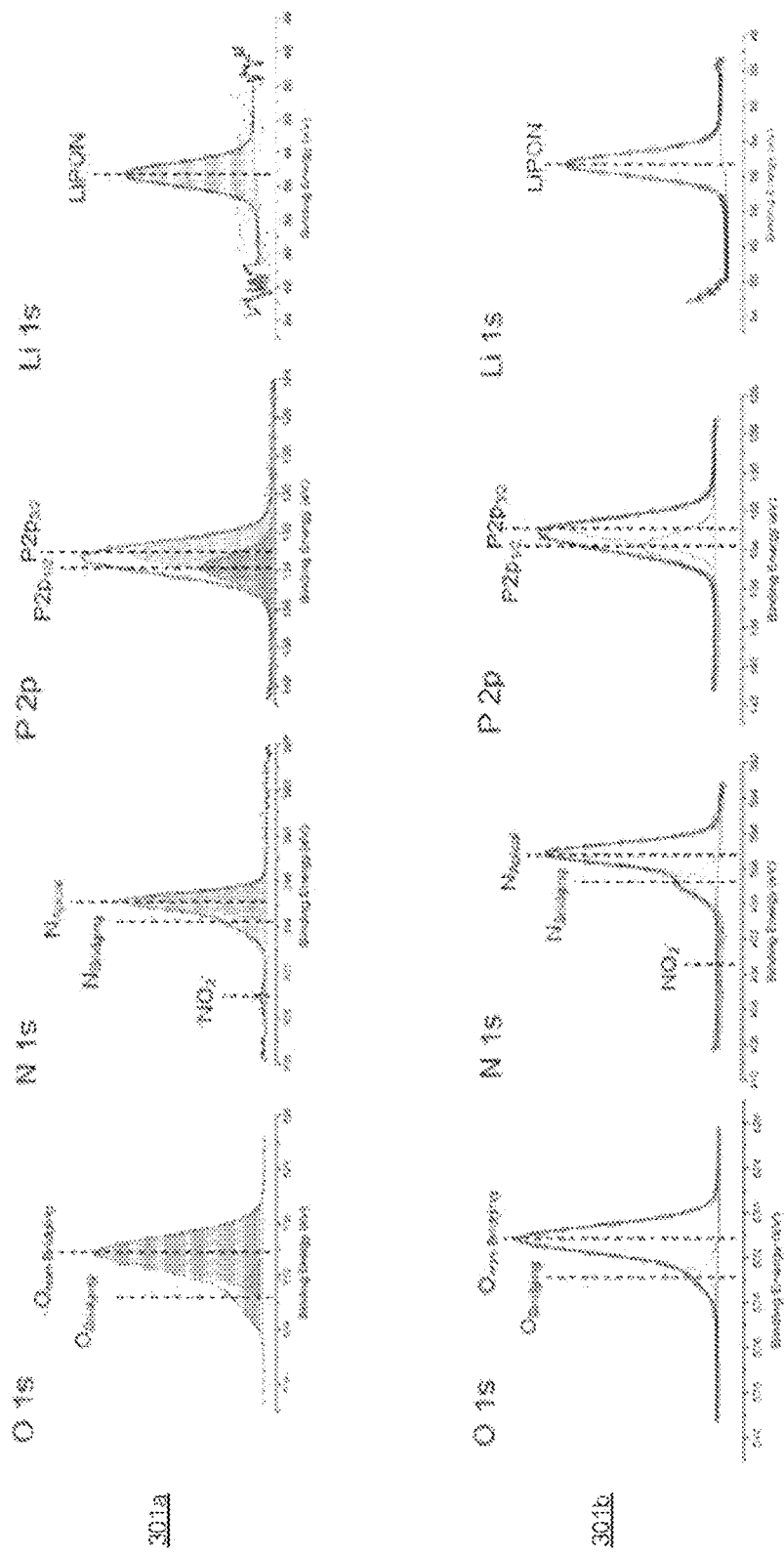
FIG. 3 shows X-ray photoelectron spectroscopy (XPS) plots comparing spectra from a LiPON reference sample and from free-standing LiPON thin films synthesized in accordance with embodiments of the present technology.

FIG. 3 shows X-ray photoelectron spectroscopy (XPS) plots comparing spectra from a LiPON reference sample (a conventional LiPON thin film deposited on a solid substrate) and from a free-standing LiPON thin film synthesized in accordance with embodiments of the present technology. XPS analyses can be used to determine chemical environments of the material at its surface. FIG. 3 includes diagrams 301a and 301b showing the XPS spectra from the LiPON reference sample and the free-standing LiPON thin film, respectively.

The XPS results of diagrams 301a and 301b show similar spectra at O 1s, N 1s, P 2p and Li 1s regions, which indicates that the free-standing LiPON thin film has the same (or similar) chemical bonding environment as the LiPON reference sample. Accordingly, the XPS results confirm that the chemical bonding configurations of the free-standing LiPON thin films are consistent with those of the conventional LiPON thin films deposited on rigid substrates.

Figure 4A:
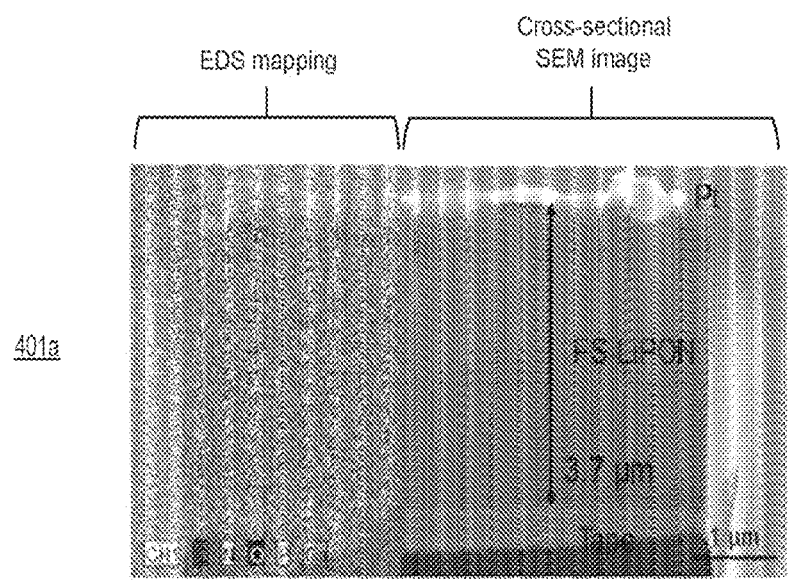
FIG. 4A shows a cross-section image and energy dispersive X-ray spectroscopy (EDS) results from free-standing LiPON thin films synthesized in accordance with embodiments of the present technology.
Figure 4A:
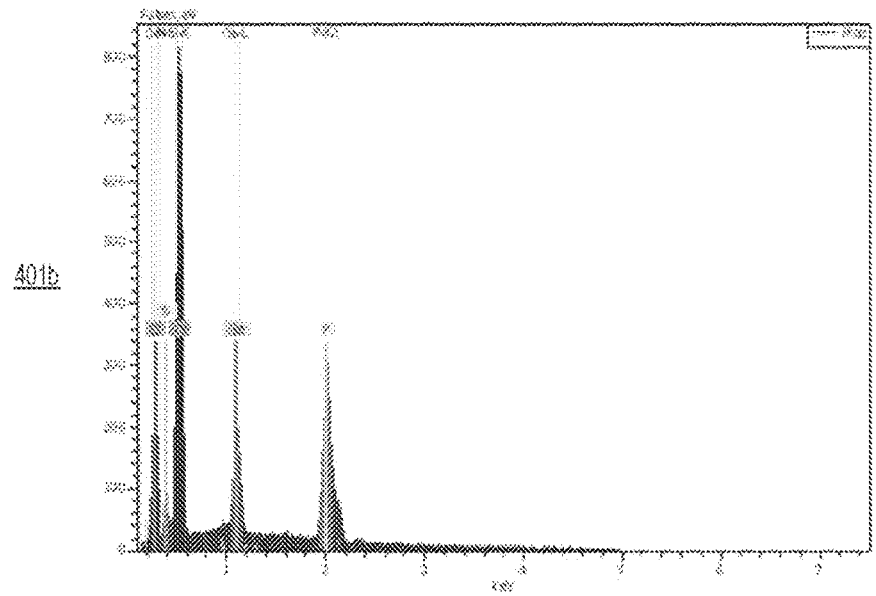

FIG. 4A shows a cross-section image and energy dispersive X-ray spectroscopy (EDS) results from free-standing LiPON thin films synthesized in accordance with embodiments of the present technology. Focused ion beam (FIB) technique is used to create a trench on the free-standing LiPON thin film to examine cross-sectional morphology of the free-standing LiPON thin film using a scanning electron microscope (SEM). Moreover, EDS mapping on the sidewall surface of the free-standing LiPON thin film provides 2-dimensional (2D) analyses that identify chemical elements included in the free-standing LiPON thin film and their distribution across its thickness. FIG. 4A includes diagrams 401a and 401b showing the EDS mapping and the cross-sectional SEM image of the free-standing LiPON thin film, and an EDS spectrum from the sidewall of the free-standing LiPON thin film, respectively.

The cross-sectional SEM image of diagram 401a shows that the free-standing LiPON thin film has a thickness of approximately 3.7 µm. The SEM image shows fully dense structural morphology without any sign of anomaly (e.g., holes, hairlines cracks). Further, the EDS mapping of diagram 401a displays the N, O, and P signals uniformly distributed across the entire thickness indicating that those primary elements of LiPON are distributed uniformly across the free-standing LiPON thin film. It should be noted that EDS mapping may be insensitive to detect the Li signal. Also, the C signal can be attributed to contamination from C contents of atmospheric air—e.g., forming carbonates. Further, the Ga signal is regarded as an artifact of the FIB technique, which is distributed out of the region of interest.

The EDS spectrum of diagram 401b corroborates with the 2D EDS results indicating that the primary elements (e.g., N, O, and P) of LiPON are detected throughout the sidewall surface of the free-standing LiPON thin film. The EDS results and the cross-sectional SEM image confirm that the free-standing LiPON thin films have fully dense morphology and chemical components uniformly distributed throughout the entire thickness of the free-standing LiPON thin film, which are consistent with the conventional LiPON thin films deposited on solid substrates.

Figure 4B:
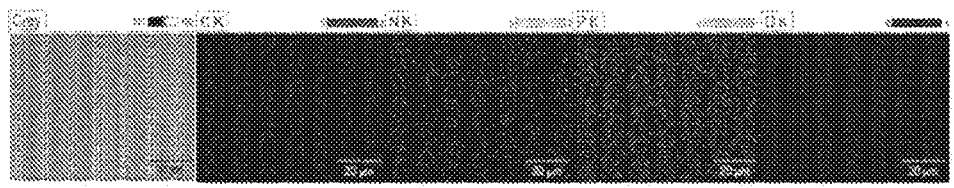
FIG. 4B shows EDS results obtained from free-standing LiPON thin films synthesized in accordance with embodiments of the present technology.
Figure 4B:
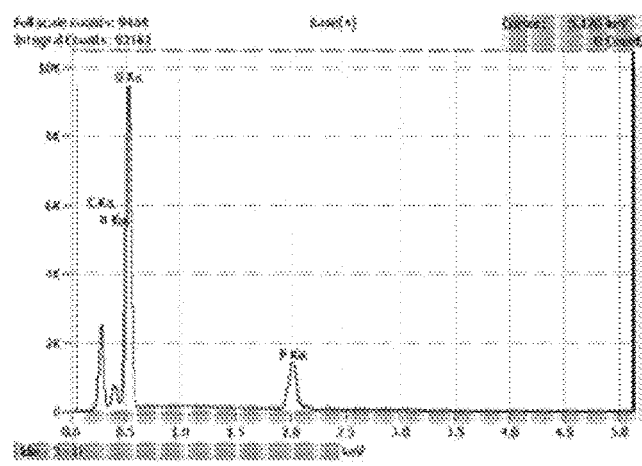

FIG. 4B shows EDS results obtained from free-standing LiPON thin films synthesized in accordance with embodiments of the present technology. The EDS results from FIG. 4B are obtained from a surface of the free-standing LiPON thin film to confirm morphology and chemical components and their distribution from the surface. FIG. 4B includes diagrams 401c, 401d, and 401e showing the 2D EDS mapping of the surface, the EDS spectrum collected from the surface, and stoichiometric information of the free-standing LiPON thin film determined from the EDS analyses, respectively.

Diagram 401c shows 2D EDS mapping results that displays uniform distribution of the N, O, and P signals across the entire surface area indicating the primary elements of LiPON are distributed uniformly across the entire surface area. It should be noted that the EDS mapping of diagram 401c covers a much wider surface area when compared to the sidewall surface area examined in the 2D EDS mapping shown in diagram 401a. The 2D EDS spectrum shown in diagram 401d, which is collected from the surface area, facilitates quantitative analyses of the primary constituents of LiPON (e.g., N, O, and P) based on the EDS spectrum. Diagram 401e shows the stoichiometry of the free-standing LiPON thin films based on the 2D EDS spectrum analyses, namely $Li_xPO_{3.66}N_{0.27}$.

Figure 5:
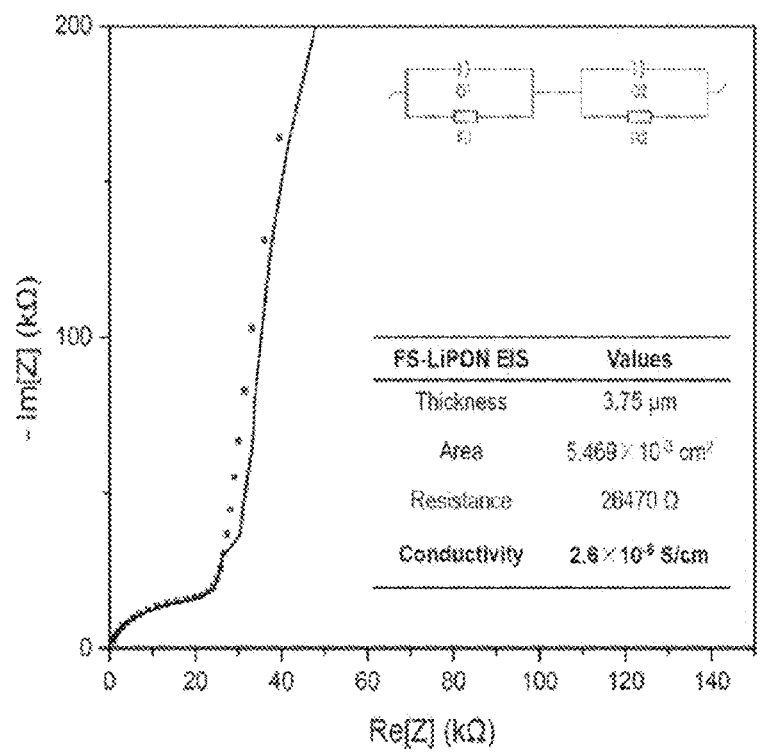
FIG. 5 shows a plot depicting EIS measurements from free-standing LiPON thin films synthesized in accordance with embodiments of the present technology.

FIG. 5 shows a plot depicting electrochemical impedance spectroscopy (EIS) measurements from free-standing LiPON thin films synthesized in accordance with embodiments of the present technology. EIS is a multifrequency AC electrochemical measurement technique measuring the electrical resistance (impedance) of the metal/solution interface over a wide range of frequencies (e.g., from 1 mHz to 1 MHz). As shown in FIG. 5, the free-standing LiPON thin films provides an ionic conductivity of $2 \times 10^{-6}$ S/cm, which agrees well with the ionic conductivity value reported from a conventional LiPON thin film deposited on a solid substrate by RF sputtering techniques.

FIG. 6 is a flowchart 600 of a method of synthesizing free-standing LiPON thin films in accordance with embodiments of the present technology. The flowchart 600 includes aspects of the methods described with reference to FIGS. 1A and 1B.

The method comprises modifying a surface of a substrate (box 610). The method further comprises forming a layer of LiPON on the modified surface of the substrate (box 615). The method further comprises separating the layer of LiPON from the substrate (box 620).

In some embodiments, the layer of LiPON separated from the substrate is a free-standing and flexible thin-film layer. In some embodiments, modifying the surface of the substrate comprises depositing a sacrificial layer on the surface of the substrate, the sacrificial layer including a first removal rate greater than a second removal rate of the layer of LiPON. In some embodiments, separating the layer of LiPON from the substrate includes selectively removing the sacrificial layer between the surface of the substrate and the layer of LiPON. In some embodiments, the sacrificial layer comprises a photoresist, and modifying the surface of the substrate comprises coating the surface of the substrate with the photoresist.

In some embodiments, coating the surface of the substrate with the photoresist comprises applying the photoresist on the surface of the substrate, and rotating the substrate with the photoresist at speeds ranging from 500 RPM to 2,000 RPM for durations ranging from 40 seconds to 80 seconds. In some embodiments, the method further comprises exposing, after rotating the substrate with the photoresist, the photoresist to ultraviolet light. In some embodiments, separating the layer of LiPON comprises dissolving the photoresist using a solvent that selectively removes the photoresist. In some embodiments, the photoresist includes AZ1512 and the solvent includes DMC. In some embodiments, dissolving the photoresist includes immersing the substrate with the layer of LiPON in a solution including DMC for twelve (12) hours.

In some embodiments, forming the layer of LiPON comprises depositing a LiPON thin film by RF sputtering a target of $Li_3PO_4$ in a nitrogen ($N_2$) environment. In some embodiments, the RF sputtering the target of $Li_3PO_4$ comprises at least one of setting the RF power to 50 W with minimal reflected power, setting the $N_2$ gas pressure at 15 mTorr, or maintaining a distance between the target and the substrate at 5 cm. In some embodiments, a deposition rate of the LiPON thin film corresponds to approximately 3 nm per minutes (e.g., 3±0.15 nm per minutes, 3±0.3 nm per minutes, 3±0.45 nm per minutes, or the like).

FIG. 7 is a flowchart 700 of a method of synthesizing free-standing LiPON thin films in accordance with embodiments of the present technology. The flowchart 700 includes aspects of the methods described with reference to FIGS. 1A and 1B.

The method comprises coating a surface of a glass substrate with a layer of photoresist (box 710). The method further comprises depositing a layer of LiPON on the layer of photoresist (box 715). The method further comprises immersing the glass substrate carrying the layer of photoresist and the layer of LiPON in a solution configured to selectively dissolve the layer of photoresist (box 720). The method further comprises lifting the layer of LiPON from the solution (box 725).

In some embodiments, coating the surface of the glass substrate with the layer of photoresist includes applying the photoresist on the surface of the glass substrate, rotating the substrate with the photoresist at speeds ranging from 500 RPM to 2,000 RPM for durations ranging from 40 seconds to 80 seconds, and exposing, after rotating the glass substrate with the photoresist, the photoresist to ultraviolet light.

In some embodiments, depositing the layer of LiPON on the layer of photoresist includes RF sputtering a target of $Li_3PO_4$ in a nitrogen ($N_2$) environment based on setting the RF power to 50 W with minimal reflected power, setting the $N_2$ gas pressure at 15 mTorr, and maintaining a distance between the target and the glass substrate at 5 cm.

In some embodiments, the photoresist comprises AZ1512. In some embodiments, the solution comprises a solvent including DMC. In some embodiments, immersing the glass substrate carrying the layer of photoresist and the layer of LiPON in the solution comprises totally submerging the glass substrate carrying the layer of photoresist and the layer of LiPON in the solution for 12 hours.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method, comprising:
modifying a surface of a substrate;
forming a layer of lithium phosphorus oxynitride (LiPON) on the modified surface of the substrate; and
separating the layer of LiPON from the substrate.

2. The method of claim 1, wherein the layer of LiPON separated from the substrate is a free-standing and flexible thin-film layer.

3. The method of claim 1, wherein modifying the surface of the substrate comprises depositing a sacrificial layer on the surface of the substrate, the sacrificial layer including a first removal rate greater than a second removal rate of the layer of LiPON.

4. The method of claim 3, wherein separating the layer of LiPON from the substrate includes selectively removing the sacrificial layer between the surface of the substrate and the layer of LiPON.

5. The method of claim 3, wherein the sacrificial layer comprises a photoresist, and wherein modifying the surface of the substrate comprises coating the surface of the substrate with the photoresist.

6. The method of claim 5, wherein coating the surface of the substrate with the photoresist comprises:
applying the photoresist on the surface of the substrate; and
rotating the substrate with the photoresist at speeds ranging from 500 revolutions per minutes (RPM) to 2,000 RPM for durations ranging from 40 seconds to 80 seconds.

7. The method of claim 6, further comprising:
exposing, after rotating the substrate with the photoresist, the photoresist to ultraviolet (UV) light.

8. The method of claim 5, wherein separating the layer of LiPON comprises dissolving the photoresist using a solvent that selectively removes the photoresist.

9. The method of claim 8, wherein the photoresist includes AZ1512 and the solvent includes dimethyl carbonate (DMC), and wherein dissolving the photoresist includes immersing the substrate with the layer of LiPON in a solution including DMC for twelve (12) hours.

10. The method of claim 1, wherein forming the layer of LiPON comprises depositing a LiPON thin film by radio frequency (RF) sputtering a target of $Li_3PO_4$ in a nitrogen ($N_2$) environment.

11. The method of claim 10, wherein RF sputtering the target of $Li_3PO_4$ comprises at least one of:
setting the RF power to 50 W with minimal reflected power;
setting the $N_2$ gas pressure at 15 mTorr; or
maintaining a distance between the target and the substrate at 5 cm.

12. The method of claim 11, wherein a deposition rate of the LiPON thin film corresponds to approximately 3 nm per minutes.

13. A lithium phosphorus oxynitride (LiPON) layer, comprising:
a first surface; and
a second surface opposite to the first surface, wherein both the first and second surfaces are not in contact with an external structure.

14. The LiPON layer of claim 13, wherein at least a portion of the LiPON layer is a free-standing and flexible thin-film layer.

15. The LiPON layer of claim 13, wherein at least a portion of the LiPON layer has a thickness of approximately 3.7 micrometers (μm).

16. The LiPON layer of claim 13, wherein at least a portion of the LiPON layer partially transmits visible lights and is flexible to bend responding to external force.

17. A method, comprising:
coating a surface of a glass substrate with a layer of photoresist;
depositing a layer of lithium phosphorus oxynitride (LiPON) on the layer of photoresist;
immersing the glass substrate carrying the layer of photoresist and the layer of LiPON in a solution configured to selectively dissolve the layer of photoresist; and
lifting the layer of LiPON from the solution.

18. The method of claim 17, wherein coating the surface of the glass substrate with the layer of photoresist includes:
applying the photoresist on the surface of the glass substrate;
rotating the substrate with the photoresist at speeds ranging from 500 revolutions per minutes (RPM) to 2,000 RPM for durations ranging from 40 seconds to 80 seconds; and
exposing, after rotating the glass substrate with the photoresist, the photoresist to ultraviolet (UV) light.

19. The method of claim 17, wherein depositing the layer of LiPON on the layer of photoresist includes:
radio frequency (RF) sputtering a target of $Li_3PO_4$ in a nitrogen ($N_2$) environment based on setting the RF power to 50 W with minimal reflected power, setting the $N_2$ gas pressure at 15 mTorr, and maintaining a distance between the target and the glass substrate at 5 cm.

20. The method of claim 17, wherein the photoresist comprises AZ1512, wherein the solution comprises a solvent including dimethyl carbonates (DMC), and wherein immersing the glass substrate carrying the layer of photoresist and the layer of LiPON in the solution comprises totally submerging the glass substrate carrying the layer of photoresist and the layer of LiPON in the solution for 12 hours.

* * * * *